(12) United States Patent
Ehben et al.

(10) Patent No.: US 6,465,868 B1
(45) Date of Patent: Oct. 15, 2002

(54) INTEGRATED CIRCUIT HAVING CAPACITIVE ELEMENTS

(75) Inventors: Thomas Ehben, Munich; Thomas Steinecke, Hofsingelding; Jens Rosenbusch, Munich, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/640,150

(22) Filed: Aug. 16, 2000

Related U.S. Application Data

(63) Continuation of application No. PCT/DE99/03829, filed on Dec. 1, 1999.

(30) Foreign Application Priority Data

Dec. 16, 1998 (DE) .......................................... 198 58 114

(51) Int. Cl.$^7$ ...................... H01L 27/108; H01L 29/76; H01L 29/00; H01L 29/94; H01L 31/119
(52) U.S. Cl. .................. 257/532; 257/534; 257/533
(58) Field of Search ................ 257/295–310, 257/530–536, 758; 361/310–314; 438/253–254, 396–398

(56) References Cited

U.S. PATENT DOCUMENTS 5,396,198 A    3/1995  Yamashita et al.
5,606,197 A    2/1997  Johansson et al.
6,146,939 A  * 11/2000  Dasgupta ..................... 438/253

FOREIGN PATENT DOCUMENTS

| DE | 43 22 354 A1 | 1/1994 |
| EP | 0 163 384 A1 | 12/1985 |
| EP | 0 656 657 A1 | 6/1995 |
| EP | 0 908 950 A2 | 4/1999 |
| JP | 02-250370 A | 10/1990 |
| JP | 04/127464 A | 4/1992 |
| JP | 09-246476 | 9/1997 |

* cited by examiner

Primary Examiner—Tom Thomas
Assistant Examiner—Cuong Quang Nguyen
(74) Attorney, Agent, or Firm—Laurence A. Greenberg; Werner H. Stemer; Gregory L. Mayback

(57) ABSTRACT

An integrated circuit having capacitive elements for smoothing a supply voltage is described. In this case, at least one additional metal electrode, which is configured as a high frequency-optimized capacitance and is distinguished by an extremely low sheet resistance, is connected in parallel with the MOS capacitances. By connecting the areally highly effective MOS capacitance, which, however, is connected with a somewhat higher impedance, in parallel with areally less effective metal capacitances, which, however, are connected to the supply voltage in a very low-impedance manner, it is possible to obtain broadband buffering and thus decoupling of high-frequency interference signals. Very high-frequency interference components are attenuated on the chip and do not pass into the system surrounding the integrated circuit.

12 Claims, 3 Drawing Sheets

INTEGRATED CIRCUIT HAVING CAPACITIVE ELEMENTS

CROSS-REFERENCE TO RELATED APPLICATION

This is a continuation of copending International Application No. PCT/DE99/03829, filed Dec. 1, 1999, which designated the United States.

BACKGROUND OF THE INVENTION

Field of the Invention

The present invention relates to an integrated circuit having capacitive elements for smoothing a supply voltage.

Integrated circuits are known in a multiplicity of embodiments and do not need to be explained in further detail. The smoothing of the supply voltage of integrated circuits by capacitors proves to be advantageous because the relevant integrated circuits can, as a result, operate in a manner free from interference and have a reduced electromagnetic emission. In this case, it is particularly advantageous, for reasons of area optimization in particular, if the capacitors which are provided for smoothing are likewise integrated in the integrated circuit. However, the capacitors provided in integrated circuits require a great deal of chip area in comparison with other integrated elements, which results in that the respective integrated circuit often becomes relatively large and hence also expensive, susceptible to faults and unwieldy.

Japanese Patent Application JP 2-250 370 A describes an integrated circuit in which the capacitors serving to smooth the supply voltage are disposed underneath the corresponding supply tracks via which the integrated circuit is supplied with the supply voltage. The capacitors are formed there by the interaction of poly sections, formed in a polysilicon layer of the integrated circuit, and the substrate regions lying underneath. All or some of the negative accompanying phenomena described above can be avoided in this way. In particular, the provision of capacitors provided for smoothing the supply voltage does not mean, or at any rate does not necessarily mean, that an integrated circuit that is constructed in such a way becomes larger than integrated circuits which do not contain such capacitors. However, to date the capacitors described in the Japanese Patent Application JP 2-250 370 A have, in many integrated circuits, not sufficed to smooth the supply voltage to the desired or required extent.

This is quite generally due to the fact that the so-called on-chip capacitances described above have a very large resistive component in their connection impedances, which results essentially from the high sheet resistances of the polysilicon or diffusion electrodes that are used in particular in the case of on-chip gate capacitances. This high resistive component in the connection impedances brings about a very low degree of attenuation at high frequencies, as a result of which high-frequency AC voltage components can be emitted into the system surrounding the integrated circuit, where such electromagnetic emissions can lead to interference with sensitive circuit elements.

SUMMARY OF THE INVENTION

It is accordingly an object of the invention to provide an integrated circuit having capacitive elements that overcomes the disadvantages of the prior art devices of this general type.

Taking the prior art as a departure point, the present invention is based on the object, therefore, of developing an integrated circuit of the generic type in such a way that the supply voltage of the circuit can be smoothed in the best possible way, in particular even in the case of high-frequency signals, without this being accompanied by an enlargement of the integrated circuit.

With the foregoing and other objects in view there is provided, in accordance with the invention, an integrated circuit including a first supply track to be connected to a first supply potential and a second supply track to be connected to a second supply potential. The first supply potential and the second supply potential supply a supply voltage, and the first supply track and the second supply track form a first metallic layer. At least one second metallic layer having at least one third supply track to be connected to the first or second supply potential is provided. The second metallic layer is disposed in each case above the first metallic layer. At least one first capacitive element is disposed below the first metallic layer and the at least one third supply track and the first supply track and/or the second supply track define at least one second capacitive element. The first and second capacitive elements are provided for smoothing over the supply voltage.

The present invention makes it possible to provide, below the respective supply tracks, a maximum number of capacitors having an optimum efficiency. The total capacitance resulting from the parallel circuit of the respective capacitances is a maximum and can consequently smooth the supply voltage as optimally as possible, in particular even in the high-frequency range of the integrated circuit, without this being accompanied by an enlargement of the integrated circuit.

Since the regions below the supply tracks are typically not utilized at all in conventional integrated circuits, the integrated circuit, as a result of the integration of at least two capacitors which are connected in parallel with one another, does not become larger, or at most becomes minimally larger, than would be the case if there were no capacitor integration. The integrated circuit according to the invention can therefore be accommodated on a minimum area.

Furthermore, the proximity of the capacitors to the supply tracks which conduct the supply voltage to be smoothed makes it possible for the electrical connections which are required in order to dispose the capacitors effectively between the two poles of the supply voltage to be configured to be extremely short, as a result of which the integrated circuit is simple in its structure and in its production and is also reliable in operation.

In accordance with an added feature of the invention, the at least one first capacitive element is connected in parallel with the at least one second capacitive element.

In accordance with an additional feature of the invention, the at least one first capacitive element is one of a plurality of first capacitive elements disposed below both the first supply track and below the second supply track, and the at least one second capacitive element is one of a plurality of second capacitive elements.

In accordance with another feature of the invention, the second capacitive elements each have a capacitance and the first capacitive elements each have a capacitance at least a factor of 10 greater than the capacitance of the second capacitive elements.

In accordance with another added feature of the invention, a substrate having doping regions formed therein is provided along with a polysilicon layer having at least one poly section disposed above the substrate. The first capacitive elements are formed by an interaction of the poly section formed in the polysilicon layer and the doping regions formed in the substrate.

In accordance with another additional feature of the invention, an insulating material is disposed between the poly section and the first and second supply tracks. The insulating material has a plurality of plated-through holes formed therein connecting the first supply track of the first metal layer to the poly section.

In accordance with yet another feature of the invention, the second capacitive element is formed by an interaction of the third supply track and the first supply track.

In accordance with a further feature of the invention, the second capacitive element is formed by an interaction of the third supply track and the second supply track.

In accordance with a further added feature of the invention, the first capacitive elements and the second capacitive elements each have a capacitive component and a resistive component connected in series with the capacitive component. The resistive component of the second capacitive elements result from conductances of the first metallic layer and the at least one second metallic layer. The resistive component of the first capacitive elements result from conductances of the poly section and of corresponding ones of the doping regions in the substrate.

In accordance with a concomitant feature of the invention, the resistive component of the first capacitive elements is at least a factor of 10 greater than the resistive component of the second capacitive elements.

Other features which are considered as characteristic for the invention are set forth in the appended claims.

Although the invention is illustrated and described herein as embodied in an integrated circuit having capacitive elements, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
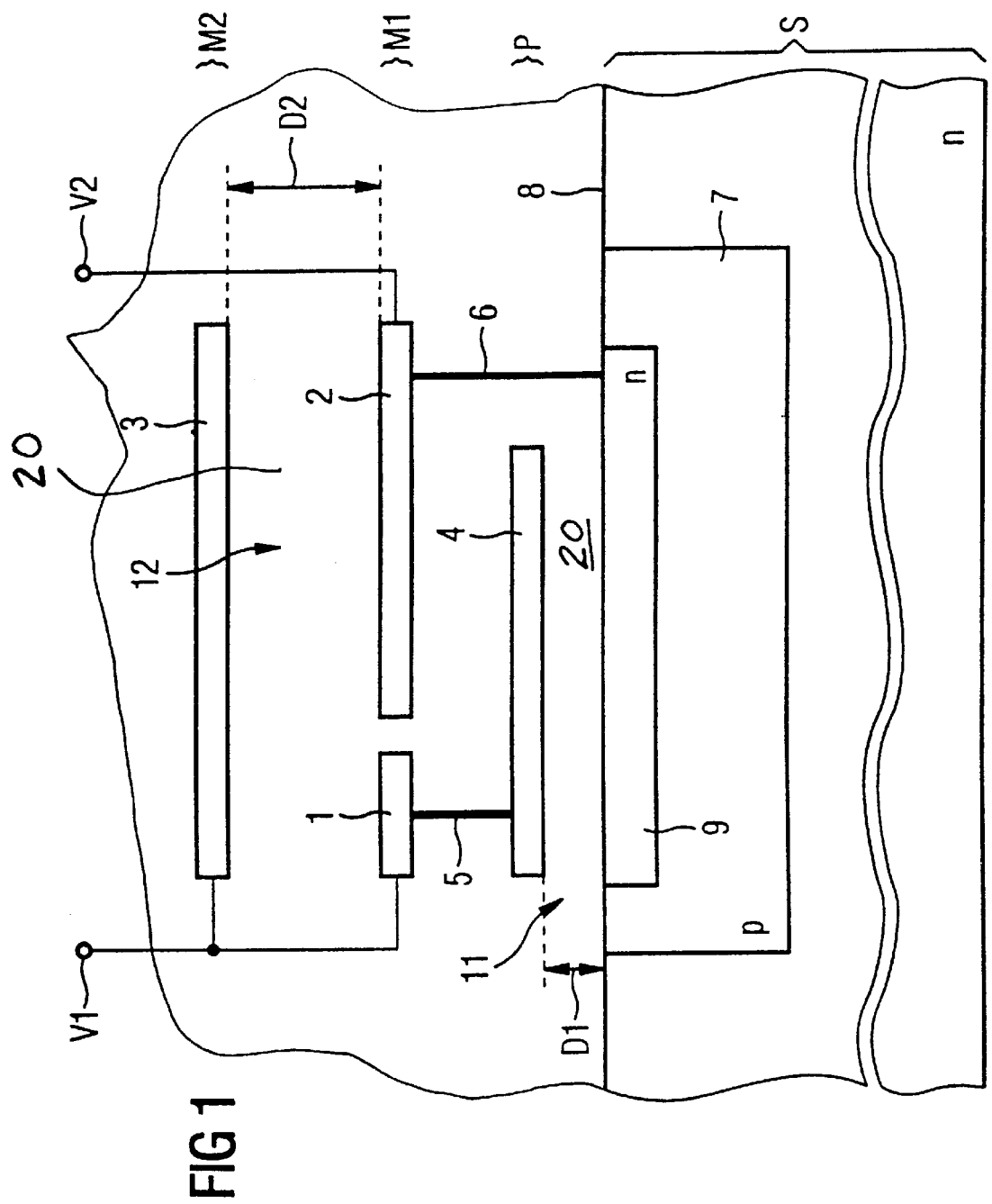
FIG. 1 is a diagrammatic, sectional view of a basic structure of an integrated circuit having capacitive elements provided for smoothing a supply voltage according to the invention, wherein a second capacitive element is formed by an interaction of the second supply track and the third supply track.

In all the figures of the drawing, sub-features and integral parts that correspond to one another bear the same reference symbol in each case. Referring now to the figures of the drawing in detail and first, particularly, to FIG. 1 thereof, there is shown schematically, in a sectional view, a basic structure of an integrated circuit having capacitive elements provided for smoothing a supply voltage. With regard to FIG. 1, it should be noted at the outset that FIG. 1—even though it is a sectional view—does not depict any hatching for reasons of clarity.

The integrated circuit that is considered in the present case may be any kind of integrated circuit, in particular a CMOS circuit. FIG. 1 merely partially illustrates a portion of the integrated circuit. In this case, the integrated circuit is integrated in a substrate S, which, for example, may be a semiconductor body composed of silicon. Disposed above the substrate S at a first distance D1 is a poly layer P, composed of polysilicon for example. Provided above the poly layer P is a first metal layer M1 disposed at a distance. Provided above the first metal layer M1 at a second distance D2 is a second metal layer M2.

The exemplary embodiment in FIG. 1 thus shows the two metal layers M1, M2 and the poly layer P lying underneath.

However, this does not preclude the possibility of still further metal layers and/or further poly layers being provided above the substrate S having the integrated circuit. The interspaces between the individual layers and/or the substrate S are filled by an insulating material 20 which typically contains silicon dioxide.

The structures of the first metal layer M1 that are shown are a first supply track 1, which is connected to a first supply potential V1, and a second supply track 2, which is connected to a second supply potential V2. Via the first and the second supply tracks 1, 2, the supply voltage is fed to those locations in the integrated circuit at which the supply voltage is required. In this case, by way of example, the first supply potential V1 may be a VDD potential and the second supply potential V2 may be a VSS supply potential. The second metal layer M2 contains a third supply track 3, which is likewise connected to the first supply potential V1 in the exemplary embodiment shown.

The poly layer P contains one or more poly sections 4 and is connected to the first supply track 1 via first plated-through holes 5. The second supply track 2 is connected to the substrate S via second plated-through holes 6.

The first supply track 1 is thus coupled via the poly section 4 in a known manner via a first capacitive element (first capacitor) 11 to the substrate S and thus to the second supply track 2. As will be described in more detail, the first capacitor 11 is disposed essentially below the supply tracks 1, 2 and is formed by the interaction of the poly section 4 and the substrate S.

According to the invention, moreover, at least one second capacitive element (second capacitor) 12 is provided, which is formed from the interaction of the second supply track 2 and the third supply track 3.

In the exemplary embodiment as shown in FIG. 1, the semiconductor body contains the n-doped substrate S. It goes without saying that it would also be conceivable to use a p-doped or undoped substrate S. A p-doped well 7 is embedded in the substrate S. The well 7 may have been introduced into the substrate S by a diffusion process, by ion implantation with an optionally subsequent thermal step, by of deposition, etc.

At least one zone 9 is embedded in the well 7 at a surface 8 of the substrate S. The zone 9 is heavily n-doped in the present exemplary embodiment. In this case, the zone 9 may likewise have been introduced into the well 7 by diffusion or ion implantation, as described above.

Typically, but not necessarily, the first zone 9 constitutes a channel implantation or a channel diffusion for the integrated circuit fabricated using CMOS technology or for the gate capacitances 11 of the integrated circuit.

The zone 9 is connected to the second supply track 2 via the second plated-through holes 6. The aforementioned zone 9 and the second plated-through holes 6 thus form the substrate contacts, the function and method of operation of which are known and do not require any further explanations.

In accordance with the illustration in FIG. 1, the two capacitors 11, 12 are provided, as already described, the first of which is provided below the supply tracks 1 and 2 and the second of which is provided above the supply track 2. The structure and the configuration of the capacitors 11, 12 described are, as has already been mentioned above, illustrated only in a highly diagrammatic fashion in FIG. 1.

The first capacitor 11 situated below the supply tracks 1 and 2 is formed by the poly section 4, the zone 9 provided underneath in the substrate S or the well 7, and the insulating material 20 lying in between. The second capacitor 12 is formed by the overlapping areas of the second and third supply tracks 2, 3 and the insulating material 20 situated in between.

As is evident from FIG. 1, the first capacitor 11 provided for smoothing the supply voltage is situated essentially below the supply tracks 1, 2. The poly section 4, which to a certain extent constitutes one of the capacitor plates, is likewise essentially disposed below the supply tracks 1, 2.

Particularly if the poly section 4 of the first capacitor 11 has a very large area, it is advantageous if the poly section 4 is connected to the first supply track 1 via a multiplicity of the first plated-through holes 5, which are advantageously disposed at the same distance from one another and in a row. As a result, the real parts of the capacitor impedances can be kept low, which is highly significant in particular for the high-frequency behavior of the capacitors 11.

Furthermore, it proves to be particularly favorable if approximately equal parts of the non-reactive resistance of the first capacitor 11 are caused by the zone 9 and the poly section 4. Typically, but not necessarily, the regions of the zone 9 that are illustrated in FIG. 1 are configured to have considerably larger areas than the relevant poly section 4.

The same applies correspondingly, of course, to the second supply track 2 as well; in this case, it is advantageous, in particular also for reasons of effectiveness, if the second supply track 2 is essentially covered by a single, large-area, namely the third, supply track 3. Since the second and third supply tracks 2, 3 are typically configured to be metallic, the real part or the resistive component in the capacitor impedance of the second capacitor 12 is, as a rule, negligible compared with the imaginary part thereof.

The schematic illustration in FIG. 1 illustrates merely a single poly section 4 and a single supply track 1, 2, 3 in each case. It goes without saying that an integrated circuit may have a multiplicity of such supply tracks 1, 2, 3 and also a multiplicity of poly sections 4. Typically, however, the separate zone 9 need not be assigned to each poly section 4; it is also possible to provide a single, large zone 9 for all the poly sections 4.

The configuration of the capacitors 11, 12 below the supply tracks 1, 2, 3 proves to be advantageous in a number of respects. First, because this space in an integrated circuit is not usually utilized in other ways and the configuration of the capacitors 11, 12 at this location consequently does not lead to an enlargement of the integrated circuit.

Secondly, it is advantageous that the indispensable connections between the supply tracks 1, 2, 3 and the capacitors 11, 12, wherever the latter are provided, can consequently be produced in a particularly simple and elegant manner.

For the structure shown in FIG. 1, therefore, an equivalent circuit diagram is produced which is described in more detail below with reference to FIGS. 2a and 2b.

Figure 2A:
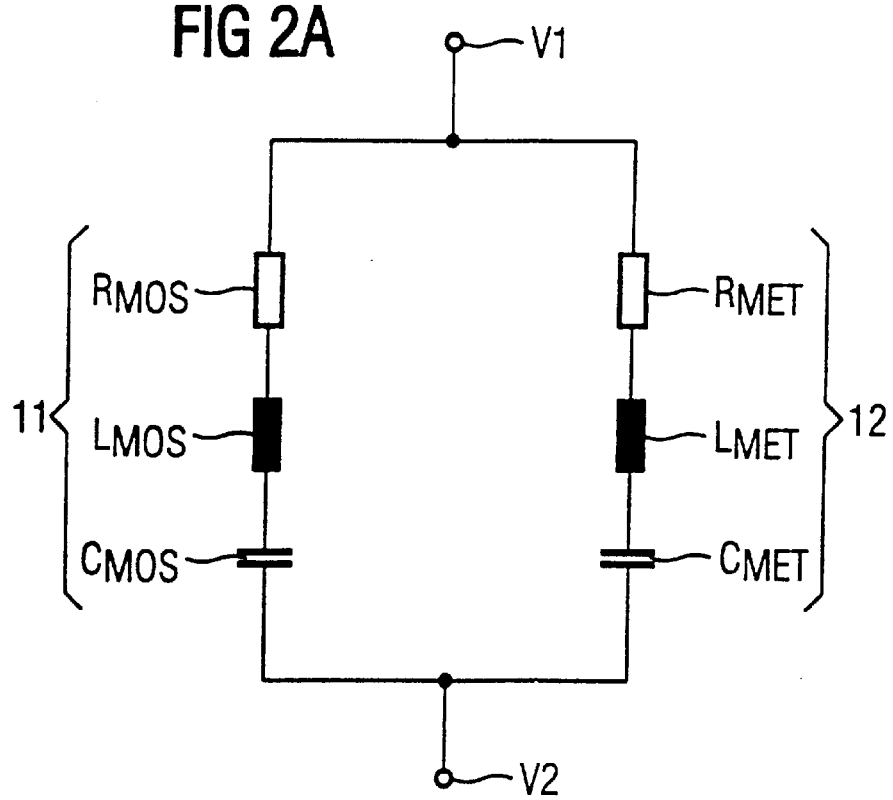
FIG. 2a is a circuit diagram for the elements of the integrated circuit shown in FIG. 1 and FIG. 3.

The parallel circuit formed by the first capacitor 11 and the second capacitor 12 and illustrated in FIG. 2a thus results from the structure shown in FIG. 1. The capacitors 11, 12 are typically to be regarded as not ideal, i.e. in addition to a capacitive component they also have an inductive and resistive component. A series circuit formed by a first capacitance $C_{MOS}$, a first inductance $L_{MOS}$ and a first resistance $R_{MOS}$ thus results for the first capacitor 11, which is also referred to as MOS capacitor below. The impedance $Z_{MOS}(S)$ of the MOS capacitor 11 is calculated in known fashion as follows:

$$Z_{MOS}(S) = R_{MOS} + S \cdot L_{MOS} + \frac{1}{S \cdot C_{MOS}}$$

In this case, S designates the complex frequency parameters $S=\sigma+j\omega$.

A series circuit formed by a second capacitance $C_{MET}$, second inductance $L_{MET}$ and second resistance $R_{MET}$ results in an equivalent manner for the second capacitor 12, which is referred to as a metal capacitor below. The corresponding impedance $Z_{MET}(S)$ of the metal capacitor 12 is calculated in an equivalent manner as follows:

$$Z_{MET}(S) = R_{MET} + S \cdot L_{MET} + \frac{1}{S \cdot C_{MET}}$$

The first series circuit resulting from the elements of the MOS capacitor 11 and the second series circuit resulting from the elements of the metal capacitor 12 are connected in parallel with one another. Consequently, the total impedance Z(S) for this parallel circuit turns out to be $$Z(S) = \frac{Z_{MOS} \cdot Z_{MET}}{Z_{MOS} + Z_{MET}}$$

The parallel circuit formed by the first series circuit and the second series circuit is in this case disposed between the first supply potential V1 and the second supply potential V2.

The particular advantage of the parallel circuit is that the first capacitive element $C_{MOS}$ is dimensioned to be very much larger than the second capacitive element $C_{MET}$. This is due in particular to the fact that the plate separation D1 of the first capacitive element $C_{MOS}$ is generally considerably smaller than the plate separation D2 of the second capacitive element $C_{MET}$, which accordingly results in that the first capacitor 11 has a much larger capacitance than the second capacitor 12. In this case, D1 usually designates the plate separation of a gate capacitance; in the case of an integrated circuit, depending on the technology used, D1 varies in the range of a few nanometers (e.g. 5–15 nm). In comparison with this, the plate separation D2 is typically at least a factor of 10 greater than the plate separation D1 (e.g. D2≧100 nm).

The inductive elements $L_{MOS}$, $L_{MET}$ result from the fact that the corresponding capacitive elements $C_{MOS}$, $C_{MET}$ generally do not constitute ideal capacitances; rather, real capacitances also quite generally have a non-negligible inductive component which becomes increasingly apparent in particular in the high-frequency region of the impedance curve.

The first resistive element $R_{MOS}$ results essentially from the resistance of the poly section 4 and also from the sum of the diffusion resistances of the zones 7, 9. The corresponding conductances of the supply tracks 1, 2 are small by comparison therewith and can generally be disregarded.

The second resistive element $R_{MET}$ results essentially from the resistances of the supply tracks 2, 3. Ideally, the resistance of the second resistive element $R_{MET}$ is virtually zero and can be disregarded compared with the very much larger resistance of the first resistive element $R_{MOS}$.

Figure 2B:
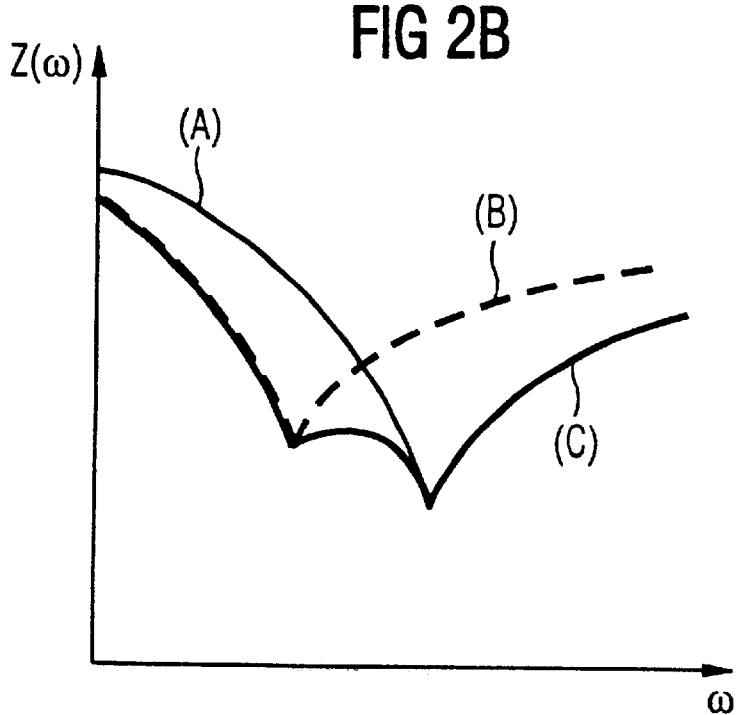
FIG. 2b is a graph showing associated impedance curves of the integrated circuit.

The respective impedance curves as a function of the frequency f are illustrated in FIG. 2b. In this case, the curve designated by (B) designates the impedance curve for the MOS capacitor 11 and the curve designated by (A) designates the impedance curve for the metal capacitor 12. The solid bold curve (C) then designates the total impedance curve for the parallel circuit formed by the two capacitors 11, 12 in accordance with FIG. 2a.

The total impedance curve (bold curve (C) in FIG. 2b) resulting from the parallel circuit exhibits a considerable improvement in the frequency response or in the attenuation response since particularly the low-impedance range between capacitive and inductive components has been significantly widened. As is known, the capacitive component is predominant in the low-frequency range through to the minimum of the impedance curve being reached, while the inductive component is predominant in the succeeding, higher-frequency range. This behavior affords a considerable increase in the effectiveness of combined MOS/metal capacitances compared with a single, pure MOS capacitance. The MOS capacitance acts at very low frequencies in the range below 200 MHz, and the metal capacitance acts at higher frequencies.

Consequently, a parallel circuit of at least two capacitances 11, 12 of this type enables broadband buffering and decoupling of high-frequency interference signals. By connecting an areally highly effective MOS capacitance 11, which, however, is connected with a somewhat higher impedance, in parallel with an areally less effective metal capacitance, which, however, is connected to the supply voltage in a very low-impedance manner, it is possible to obtain broadband buffering and thus decoupling of high-frequency interference signals. Very high-frequency interference components are thus attenuated on the chip and no longer pass into the system surrounding the integrated circuit.

Although the structure illustrated in FIG. 1 is currently regarded as the simplest capacitor configuration according to the invention, this should not be understood as a restriction of the invention. In principle, the capacitors 11, 12 can also be disposed arbitrarily differently below the supply tracks 1, 2, 3. It is particularly advantageous, however, if the first capacitor 11 and/or the second capacitor 12 are connected with the largest possible area.

The present invention has been explained in particular using a simple single MOS capacitance 11. It goes without saying, however, that the invention can also be extended to arbitrary integrated circuits, configured for example using CMOS technology, with however many of such MOS capacitors 11 as are desired. Integrated circuits configured using CMOS technology, in particular, typically have at least two of these MOS capacitances, which are constructed such that they are mutually complementary.

Furthermore, the present invention has been explained using the single metal capacitance 12 connected in parallel with the single MOS capacitance 11. In particular, it is also particularly advantageous if a plurality of metal capacitors 12 according to the invention are connected in parallel with each MOS capacitor 11. In particular, by virtue of the dimensioning of the MOS capacitors 11 and the metal capacitors 12 of the parallel circuit, the latter can be optimally adapted to the respective frequency spectrum and, consequently, very broadband buffering can be achieved.

Figure 3:
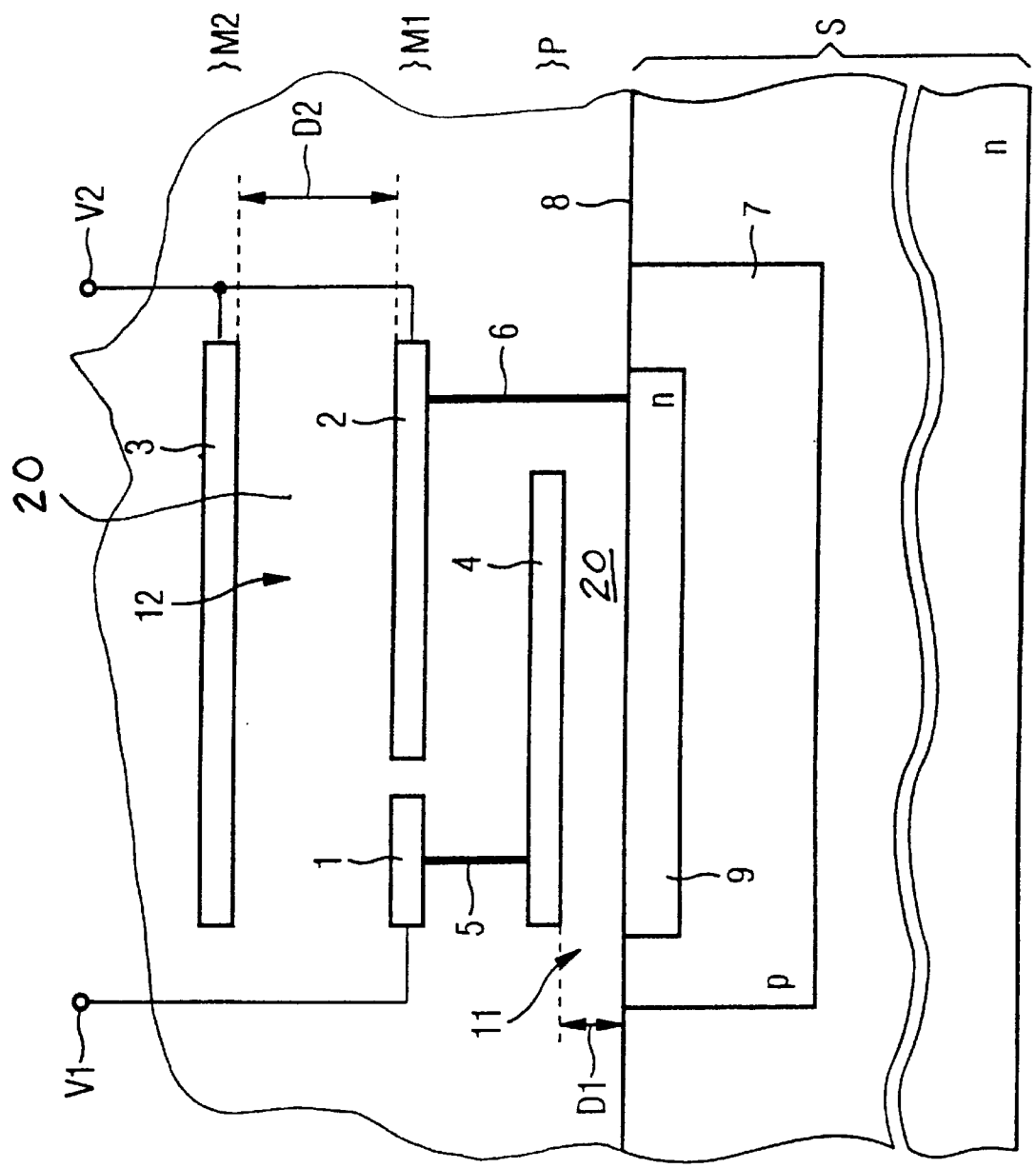
FIG. 3 is a diagrammatic, sectional view of a basic structure of an integrated circuit having capacitive elements provided for smoothing a supply voltage according to the invention, wherein a second capacitive element is formed by an interaction of the first supply track and the third supply track.

The structure shown in FIG. 3 is almost identical with that in FIG. 1, except that the second capacitive element is formed by an interaction of the first supply track 1 and the third supply track 3. The above description in connection with FIG. 1 is also applicable to FIG. 3.

In summary and in conclusion, it may be emphasized that the integrated circuit described can be accommodated on a minimal area in a very simple manner.

We claim:

1. An integrated circuit, comprising:
   a first supply track to be connected to a first supply potential;
   a second supply track to be connected to a second supply potential, the first supply potential and the second supply potential supplying a supply voltage, said first supply track and said second supply track forming a first metallic layer;
   at least one second metallic layer having at least one third supply track to be connected to one of the first supply potential and the second supply potential and disposed in each case above said first metallic layer;
   at least one first capacitive element disposed below said first metallic layer; and
   at least one second capacitive element defined by said at least one third supply track and at least one of said first supply track and said second supply track;
   said at least one first capacitive element and said at least one second capacitive element being connected in parallel and smoothing over the supply voltage;
   said at least one first capacitive element being one of a plurality of first capacitive elements disposed below both said first supply track and said second supply track, and said at least one second capacitive element being one of a plurality of second capacitive elements;
   said second capacitive elements each having a capacitance and said first capacitive elements each having a capacitance being at least a factor of 10 greater than said capacitance of said second capacitive elements.

2. The integrated circuit according to claim 1, including:
   a substrate having doping regions formed therein; and
   a polysilicon layer having at least one poly section disposed above said substrate, said first capacitive elements formed by an interaction of said at least one poly section formed in said polysilicon layer and said doping regions formed in said substrate.

3. The integrated circuit according to claim 2, including an insulating material disposed between said at least one poly section and said first and second supply tracks, said insulating material having a plurality of plated-through holes formed therein connecting said first supply track of said first metal layer to said at least one poly section.

4. The integrated circuit according to claim 1, wherein said at least one second capacitive element is formed by an interaction of said at least one third supply track and said first supply track.

5. The integrated circuit according to claim 1, wherein said at least one second capacitive element is formed by an interaction of said at least one third supply track and said second supply track.

6. The integrated circuit according to claim 2, wherein said first capacitive elements and said second capacitive elements each have a capacitive component and a resistive component connected in series with said capacitive component, said resistive component of said second capacitive elements substantially resulting from conductances of said first metallic layer and said at least one second metallic layer, and said resistive component of said first capacitive elements substantially resulting from conductances of said at least one poly section and of corresponding ones of said doping regions in said substrate.

7. The integrated circuit according to claim 6, wherein said resistive component of said first capacitive elements is at least a factor of 10 greater than said resistive component of said second capacitive elements.

8. An integrated circuit, comprising:

a first supply track to be connected to a first supply potential;

a second supply track to be connected to a second supply potential, the first supply potential and the second supply potential supplying a supply voltage, said first supply track and said second supply track forming a first metallic layer;

at least one second metallic layer having at least one third supply track to be connected to one of the first supply potential and the second supply potential and disposed in each case above said first metallic layer;

a substrate having doping regions formed therein;

a polysilicon layer having at least one poly section disposed above said substrate;

at least one first capacitive element disposed below said first metallic layer, formed by an interaction of said at least one poly section formed in said polysilicon layer and said doping regions formed in said substrate; and at least one second capacitive element defined by said at least one third supply track and at least one of said first supply track and said second supply track;

said at least one first capacitive element and said at least one second capacitive element being connected in parallel and smoothing over the supply voltage;

said at least one first capacitive element being one of a plurality of first capacitive elements disposed below both said first supply track and said second supply track, and said at least one second capacitive element being one of a plurality of second capacitive elements;

said first capacitive elements and said second capacitive elements each having a capacitive component and a resistive component connected in series with said capacitive component, said resistive component of said second capacitive elements substantially resulting from conductances of said first metallic layer and said at least one second metallic layer, and said resistive component of said first capacitive elements substantially resulting from conductances of said at least one poly section and of corresponding ones of said doping regions in said substrate;

said resistive component of said first capacitive elements being at least a factor of 10 greater than said resistive component of said second capacitive elements.

9. The integrated circuit according to claim 8, wherein said capacitive component of said first capacitive elements is at least a factor of 10 greater than said capacitive component of said second capacitive elements.

10. The integrated circuit according to claim 8, including an insulating material disposed between said at least one poly section and said first and second supply tracks, said insulating material having a plurality of plated-through holes formed therein connecting said first supply track of said first metal layer to said at least one poly section.

11. The integrated circuit according to claim 8, wherein said at least one second capacitive element is formed by an interaction of said at least one third supply track and said first supply track.

12. The integrated circuit according to claim 8, wherein said at least one second capacitive element is formed by an interaction of said at least one third supply track and said second supply track.

\* \* \* \* \*